(12) United States Patent
Cheng et al.

(10) Patent No.: US 11,585,854 B1
(45) Date of Patent: Feb. 21, 2023

(54) RUNTIME MEASUREMENT OF PROCESS VARIATIONS AND SUPPLY VOLTAGE CHARACTERISTICS

(71) Applicant: Xilinx, Inc., San Jose, CA (US)

(72) Inventors: Da Cheng, San Jose, CA (US); Nui Chong, San Jose, CA (US); Amitava Majumdar, San Jose, CA (US); Ping-Chin Yeh, San Jose, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 471 days.

(21) Appl. No.: 16/108,596

(22) Filed: Aug. 22, 2018

(51) Int. Cl.
*G01R 31/319* (2006.01)
*G01R 31/3185* (2006.01)
*G01R 31/317* (2006.01)
*G01R 31/28* (2006.01)
*H03K 3/03* (2006.01)
(Continued)

(52) U.S. Cl.
CPC ... *G01R 31/31922* (2013.01); *G01R 31/2884* (2013.01); *G01R 31/3191* (2013.01); *G01R 31/31727* (2013.01); *G01R 31/318527* (2013.01); *G01R 19/165* (2013.01); *G01R 19/16576* (2013.01); *G01R 31/2824* (2013.01); *G01R 31/2837* (2013.01); *G01R 31/31725* (2013.01); *G06F 1/26* (2013.01); *G06F 1/32* (2013.01); *G06F 1/3203* (2013.01); *G06F 1/324* (2013.01); *G06F 1/3206* (2013.01); *G06F 1/3296* (2013.01); *G06F 13/4291* (2013.01); *H03K 3/0315* (2013.01);
(Continued)

(58) Field of Classification Search
CPC .. H03K 3/0315; H03K 3/011; H03K 19/0008; H03K 19/0016; H03K 19/17784; G06F 1/3296; G06F 1/324; G06F 1/3206; G06F 1/3203; G06F 13/4291; G06F 1/26; G06F 1/32; H03L 7/0995; G01R 31/31725; G01R 19/165; G01R 19/16576; G01R 31/2824; G01R 31/2837; G01R 31/31922
See application file for complete search history.

(56) References Cited

U.S. PATENT DOCUMENTS

2010/0031065 A1* 2/2010 Futa .................. H04L 9/0866 713/194
2012/0182054 A1* 7/2012 Sabapathy .............. G01K 7/01 327/172

(Continued)

*Primary Examiner* — Cynthia Britt
*Assistant Examiner* — Sazzad Hossain
(74) *Attorney, Agent, or Firm* — Crawford Maunu PLLC

(57) ABSTRACT

Circuits and methods involve an integrated circuit (IC) device, a plurality of application-specific sub-circuits, and a plurality of instances of a measuring circuit. The application-specific sub-circuits are disposed within respective areas of the IC device. Each instance of the measuring circuit is associated with one of the application-specific sub-circuits and is disposed within a respective one of the areas of the device. Each instance of the measuring circuit further includes a ring oscillator and a register for storage of a value indicative of an interval of time. Each instance of the measuring circuit is configured to measure passage of the interval of time based on a first clock signal, count oscillations of an output signal of the ring oscillator during the interval of time, and output a value indicating a number of oscillations counted during the interval of time.

19 Claims, 8 Drawing Sheets

(51) Int. Cl.
  *G06F 13/42* (2006.01)
  *H03L 7/099* (2006.01)
  *H03K 19/00* (2006.01)
  *G06F 1/324* (2019.01)
  *G06F 1/3206* (2019.01)
  *H03K 19/17784* (2020.01)
  *G01R 19/165* (2006.01)
  *G06F 1/26* (2006.01)
  *G06F 1/32* (2019.01)
  *G06F 1/3203* (2019.01)
  *G06F 1/3296* (2019.01)

(52) U.S. Cl.
  CPC ..... *H03K 19/0008* (2013.01); *H03K 19/0016* (2013.01); *H03K 19/17784* (2013.01); *H03L 7/0995* (2013.01)

(56) References Cited

U.S. PATENT DOCUMENTS

| | | | |
|---|---|---|---|
| 2015/0241955 A1* | 8/2015 | Kosonocky | G06F 1/3296 713/320 |
| 2016/0091560 A1* | 3/2016 | Chien | H03K 5/26 324/750.3 |
| 2017/0115351 A1* | 4/2017 | Datla Jagannadha | G06F 11/00 |
| 2019/0317547 A1* | 10/2019 | Savoj | H03K 3/0315 |

* cited by examiner

RUNTIME MEASUREMENT OF PROCESS VARIATIONS AND SUPPLY VOLTAGE CHARACTERISTICS

TECHNICAL FIELD

The disclosure generally relates to power and performance monitoring of application-specific circuitry on an integrated circuit.

BACKGROUND

As semiconductor dies increase in size, process variations across the die are more likely to cause variations in power consumption and performance of circuitry instantiated at different locations on the die. As a die ages, the power and performance profile can change. Small differences in power and performance between different areas of the die may become more pronounced over time. Adverse aging effects may be even greater in multi-die packages. Changes in performance can lead to operational anomalies, and finding and repairing the root-cause of a problem can be complex and costly.

SUMMARY

A disclosed circuit arrangement includes an integrated circuit (IC) device, a plurality of application-specific sub-circuits, and a plurality of instances of a measuring circuit. The application-specific sub-circuits are disposed within respective areas of the IC device. Each instance of the measuring circuit is associated with one of the application-specific sub-circuits and is disposed within a respective one of the areas of the device. Each instance of the measuring circuit further includes a ring oscillator and a register for storage of a value indicative of an interval of time. Each instance of the measuring circuit is configured to measure passage of the interval of time based on a first clock signal, count oscillations of an output signal of the ring oscillator during the interval of time, and output a value indicating a number of oscillations counted during the interval of time.

A disclosed method includes selecting one or more areas of a plurality of areas of an integrated circuit (IC) device for evaluation. A plurality of application-specific sub-circuits are disposed within non-overlapping areas of the IC device, respectively, and a plurality of instances of a measuring circuit are disposed in the areas of the IC, respectively. The method includes configuring one or more reprogrammable registers disposed within the one or more areas, respectively, with a value indicative of an interval of time and measuring passage of the interval of time by one or more timer circuits disposed within the one or more areas, respectively, based on a first clock signal. During the interval of time, the instances of the measuring circuit count oscillations of one or more ring oscillators disposed within the one or more areas, respectively. After expiration of the interval of time, the instances of the measuring circuit output one or more values indicating one or more numbers of oscillations counted during the interval of time in the one or more areas.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
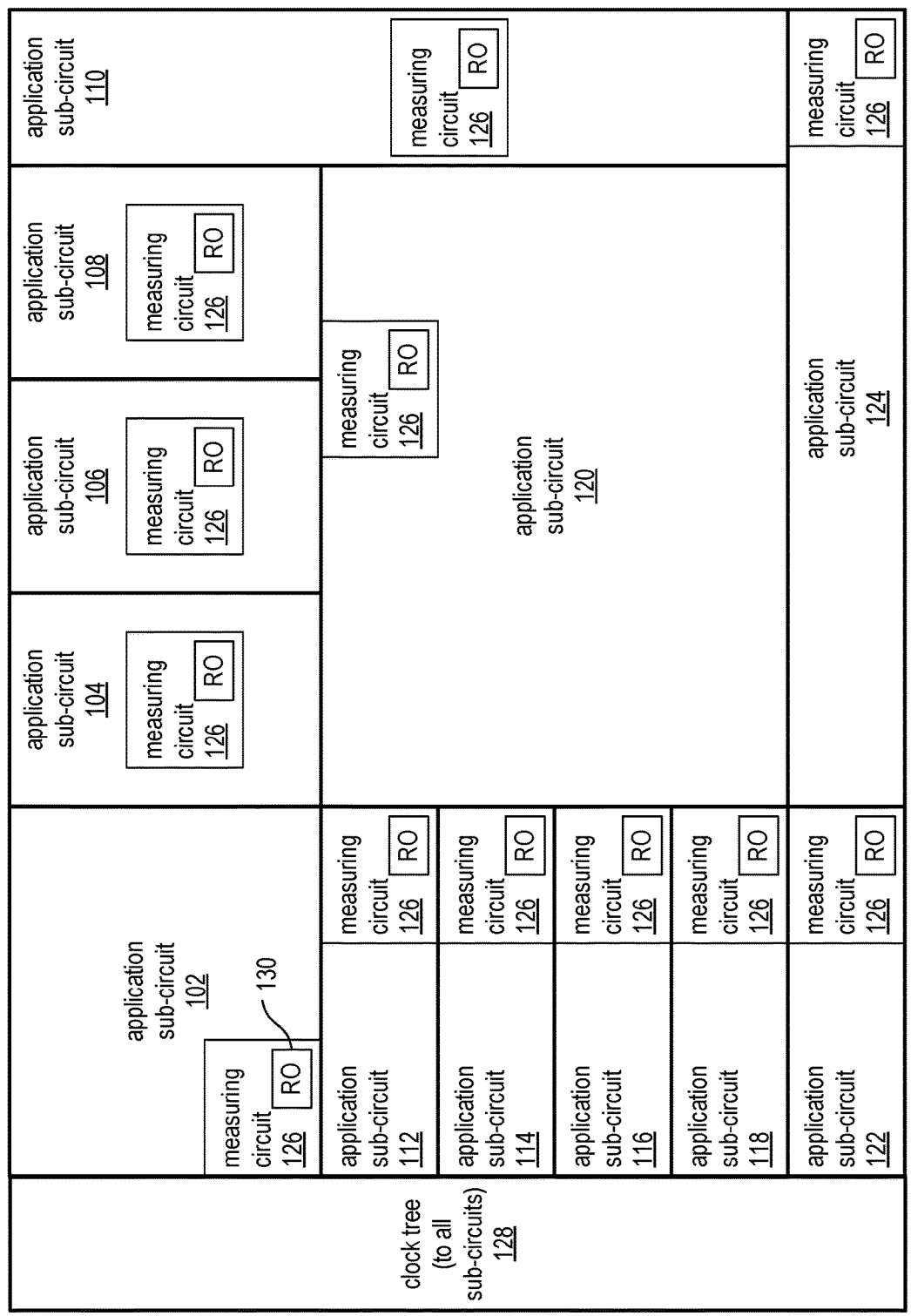
FIG. 1 shows an IC device having application-specific sub-circuits implemented within respective areas of the die, and associated instances of a measuring circuit disposed within the respective areas of the application-specific sub-circuits.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods are suitable for an individual integrated circuit die or an IC package having multiple IC dice. The term "IC device" is used herein to connote both an IC die and an IC package. Respective instances of a measuring circuit are disposed within areas of an IC device occupied by application-specific sub-circuits of the device. Each application-specific sub-circuit can have an associated instance of the measuring circuit, and each instance can serve as a proxy for measuring performance of the associated application-specific sub-circuit.

An application-specific sub-circuit is a sub-circuit implemented from a core logic design that is sometimes referred to as an intellectual property (IP) core. Each IP core provides a particular function and can be integrated with other IP cores to construct a complete circuit design. IP cores are structured for design reuse, which allows the IP core to be used as a component in different circuit designs for different target devices, such as field programmable gate arrays (FPGAs) or application-specific integrated circuits (ASICs). Many IP cores are portable across the technologies of different target devices. Examples of IP cores include, but are not limited to, Input/Output (I/O) controllers, network controllers, bus interfaces, graphics processing units (GPUs), central processing units (CPUs), blocks of random access memory (RAM), point-to-point switches, etc.

Each instance of the measuring circuit can include one or more ring oscillators (ROs) and a ripple counter. External control circuitry can enable RO to oscillate and read out the number of cycles counted over a period of time, which can be specified in a programmable register. The frequency of the RO can be determined by referencing to a clock signal having a known frequency. The frequency of the oscillator can provide variability data resulting from process corners and local circuit activities.

Because the measuring circuit is replicated and distributed as multiple instances in different application-specific sub-circuits on an IC device, frequency data from each instance serves as a performance proxy for the local application-specific sub-circuit. Instead of an even distribution of measuring circuits across the area of the device, the layout of the instances of the measuring circuit follows the layout of the application-specific sub-circuits, allowing the performance gap of a particular application-specific sub-circuit to be benchmarked against other application-specific sub-circuits and baseline process monitoring devices. Also the frequency variability of all locations, which can number in the hundreds, for example, can be used for within-die process variation monitoring and control. Selected instances of the measuring circuit can be activated on-demand and measure performance during run-time operations of the application-specific sub-circuits, which enables real-time circuit monitoring and tuning for power rail voltage fluctuations caused by circuit activities in mission mode.

In accordance with the disclosed circuits and methods, application-specific sub-circuits are disposed within designated areas of an IC device. The IC device can be implemented on a single semiconductor die or on multiple semiconductor dies in a package. Each of the application-specific sub-circuits has an associated instance of a measuring circuit that is disposed within the area occupied by the application-specific sub-circuit. Each instance of the measuring circuit includes a ring oscillator and a reprogrammable register. An interval of time over which the measuring circuit counts oscillations of the ring oscillator can be indicated by a value stored in the register. Each instance of the measuring circuit is operable to count oscillations of the ring oscillator while the associated application-specific sub-circuit is performing application functions. The instance of the measuring circuit tracks passage of the interval of time based on a master clock signal having a known frequency and counts oscillations of the ring oscillator during the interval. At expiration of the interval, the measuring circuit outputs a value indicating a number of oscillations counted.

The disclosed circuitry can be employed in a number of scenarios involving analysis of an integrated circuit. Voltage drops on the power rail of an IC device can be detected with real-time monitoring by the instances of the measuring circuit. Processing loads can be balanced across particular applications on the device based on detected voltage drops as indicated by oscillation counts. Oscillation counts accumulated over time can be used to evaluate the reliability and aging of the device. Individual dice can be qualified based on oscillation counts and performance metrics.

FIG. 1 shows an IC device 100 having application-specific sub-circuits implemented within respective areas of the die, and associated instances of a measuring circuit disposed within the respective areas of the application-specific sub-circuits. The IC device can be an individual semiconductor die or a package having multiple semiconductor dice. The application-specific sub-circuits are shown as blocks 102, 104, 106, 108, 110, 112, 114, 116, 118, 120, 122, and 124. Each application-specific sub-circuit is disposed in a separate area of the device and can assume a different shape. The IC device can have multiple instances of the same application-specific sub-circuit and separate associated instances of the measuring circuit. The IC device further includes clock tree circuitry 128 that connects to all the application-specific sub-circuits and instances 126 of the measuring circuit. The clock tree circuitry distributes one or more clock signals to the circuitry of the device 100.

Each application-specific sub-circuit, or instance thereof, on the IC device 100 has an associated instance 126 of the measuring circuit. Each instance of the measuring circuit is placed, such as by a place-and-route tool, within the area of the device in which the associated application-specific circuit is placed. Each instance of the measuring circuit has a ring oscillator (RO). For example, the instance of the measuring circuit associated with application-specific sub-circuit 102 is shown as having ring oscillator 130. The instances of the measuring circuit further include circuitry that counts the number of oscillations of the ring oscillators occurring within an interval of time specified by a programmable value. In some implementations, each instance of the measuring circuit can include multiple ring oscillators, and one of the ring oscillators can be selected for counting the oscillations thereof. In addition, in some implementations each ring oscillator can be a configurable circuit structure that allows operation at different resonant frequencies.

Notably, the instances of the measuring circuit are configurable to indirectly monitor performance of the associated application-specific sub-circuits while the application-specific sub-circuits are performing application functions. Application functions are functions of the sub-circuit other than those that directly implement test or debug features, which include scan functions, error logging, and trace functions. Clock signals distributed by the clock tree 128 drive the application-specific sub-circuits while the instances of the measuring circuit count oscillations of the ring oscillators. The instances of the measuring circuit can give an indication of the performance level of the associated application-specific sub-circuit rather than an indication of device behavior at a particular location without indication of the application-specific sub-circuit occupying that region.

The IC device can further include scan circuitry (not shown) that is connected to all application-specific sub-circuits and instances of the measuring circuit. As generally recognized, the scan circuitry provides channels and controls for scanning-in and scanning-out data for testing and debugging.

Control over the instances of the measuring circuits is also provided through the scan circuitry. Multiple scan paths can be provided, such as a subset of the scan paths provided for data and a different subset for control and status. The two subsets can overlap depending on implementation requirements. One or more different instances of the measuring circuit can be separately activated through the scan circuitry, and multiple instances can be operated concurrently. The time interval over which oscillations are counted can be specified by scanning a value into a scan register. Other scan registers can be used to select a particular ring oscillator from multiple ring oscillators available in an instance of the measuring circuit. Still other scan registers can be used to configure a ring oscillator to operate at an approximation of a desired frequency.

Figure 2:
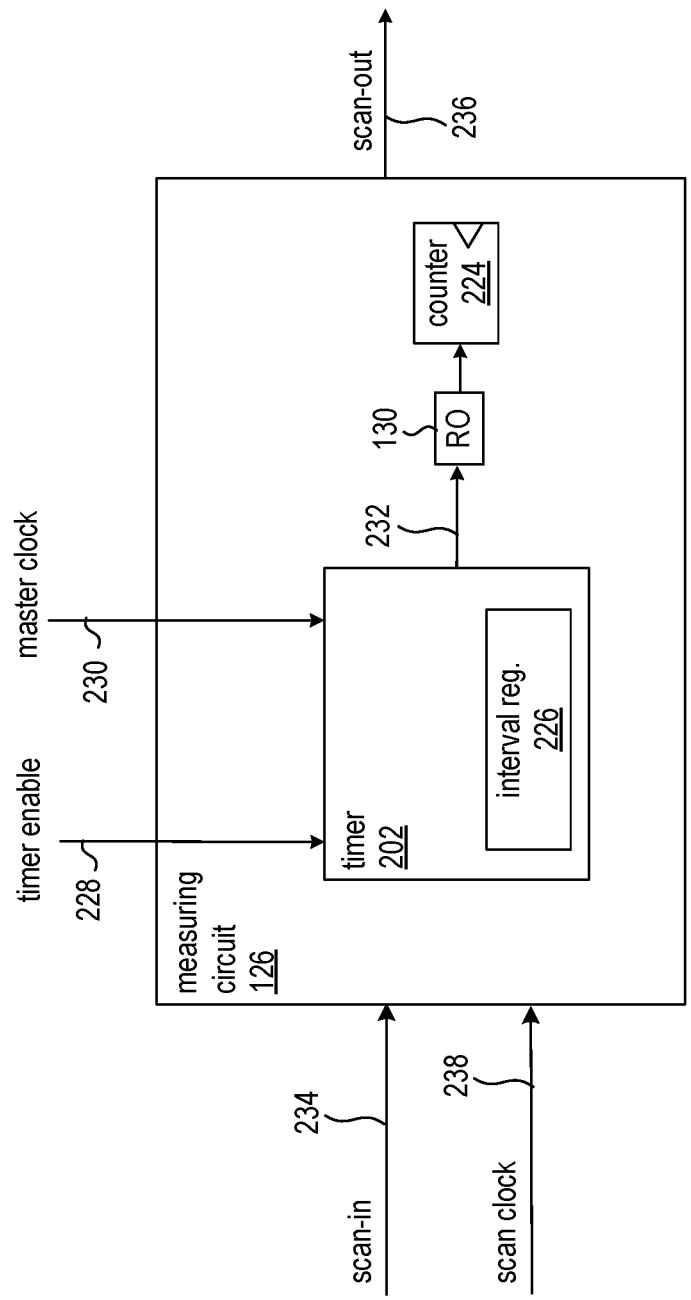
FIG. 2 shows an exemplary measuring circuit.

FIG. 2 shows an exemplary measuring circuit 126. The measuring circuit generally includes a timer circuit 202, a counter circuit 224, and a ring oscillator 130. The timer circuit is configured to track an interval of time, the duration of which can be specified in the interval register 226. The timer circuit can be activated by a timer enable signal 228 and can be clocked by a master clock signal 230, which has a known frequency. In response to the timer enable signal, the timer circuit can generate a control signal 232 in an enable state during the interval, and generate the control signal in a disable state upon expiration of the interval. The control signal is provided to the ring oscillator 130.

When enabled by the control signal 232, the oscillating signal of the ring oscillator is provided to the counter circuit 224, which counts oscillations. The ring oscillator 130 stops in response to the control signal 232 indicating a disable state.

The controls of and data generated by the measuring circuit 126 can be accessed via scan circuitry. For example, the interval register 226 can be configured via scan-in signal 234. The value generated by counter circuit 224 can be scanned out via scan-out signal 236. Scanning-in and scanning-out can be timed by scan clock signal 238, and though not shown, it will be appreciated that a scan enable signal can be used to enable scanning-in and scanning-out.

Figure 3:
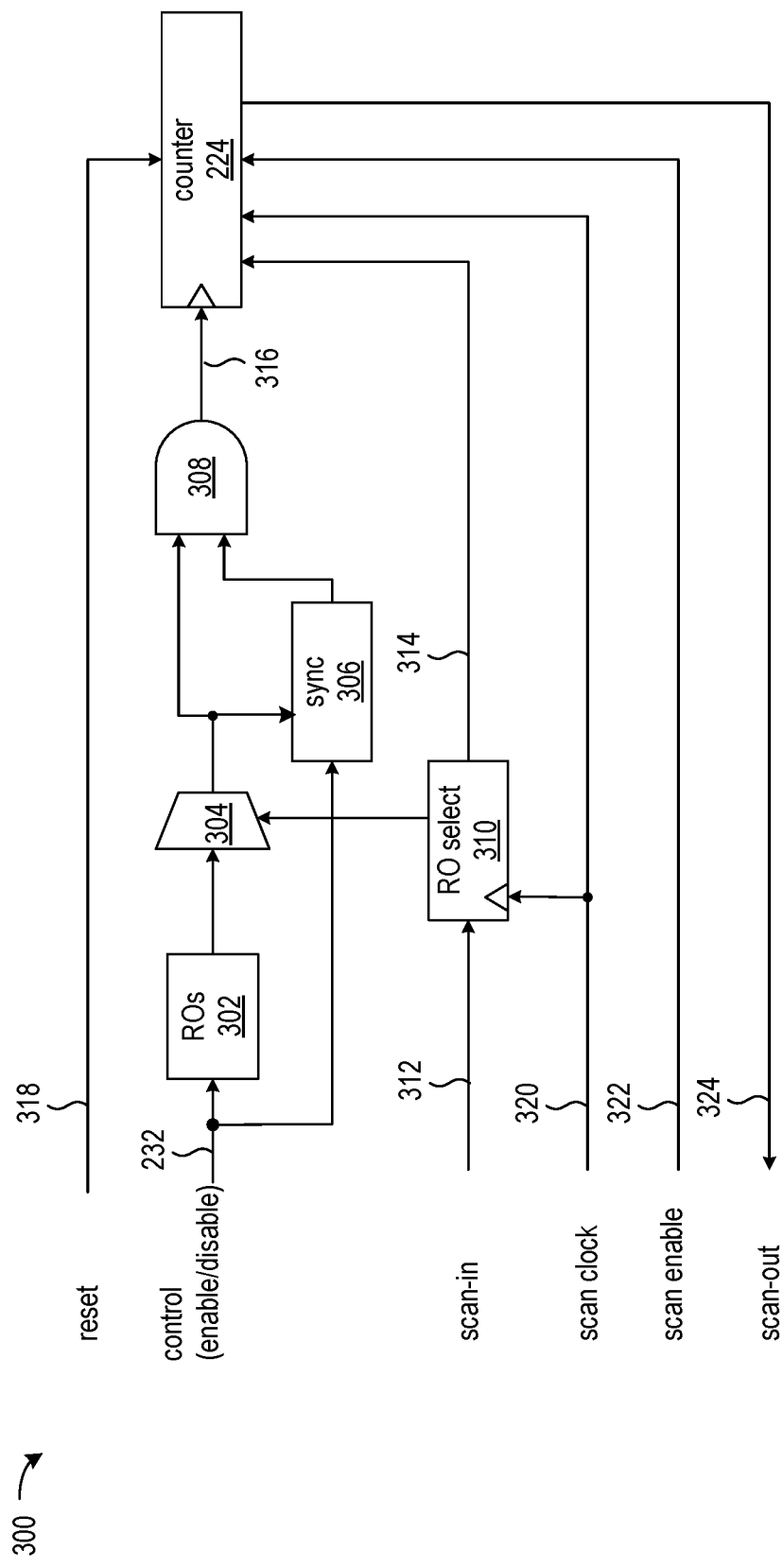
FIG. 3 shows an arrangement of multiple ring oscillators, and a counter circuit that counts the oscillations of the output signal from a selected one of the ring oscillators.

FIG. 3 shows an arrangement 300 of multiple ring oscillators 302, and a counter circuit 224 that counts the oscillations of the output signal from a selected one of the ring oscillators. The control signal 232 activates and deactivates the ring oscillators 302. The output signals from the ring oscillators are input to the multiplexer 304, which selects one of the output signals in response to the state of the select register 310. One of the ring oscillators can be selected by scanning-in a selection code to select register 310 by scan-in signal 312. A scan-out pin on the select register 310 is connected to the counter 224 as scan signal 314.

The synchronization circuit 306 generates a synchronization signal to AND gate 308 in response to the state of the control signal 232 and the ring oscillator signal output signal selected by the multiplexer 304. The output of AND gate 308 is provided as oscillating signal 316 to the counter 224.

The reset signal 318 is provided to reset the counter 224 to a 0 value. Scan signals 320, 322, and 324 provide scan functions to the counter 224.

Figure 4:
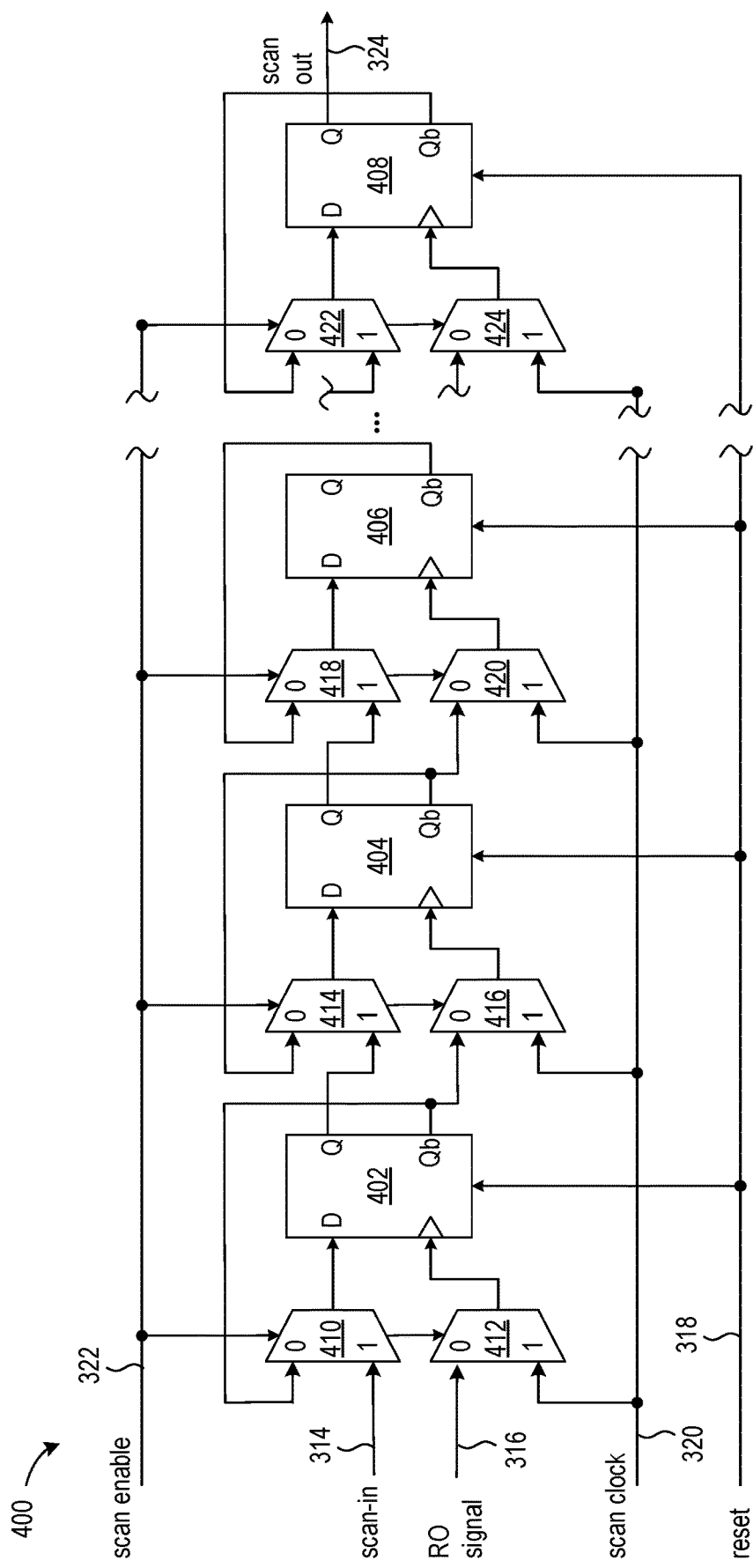
FIG. 4 shows an exemplary ripple counter that can implement the counter for counting oscillations of the output signal from a ring oscillator.

FIG. 4 shows an exemplary ripple counter 400 that can implement the counter for counting oscillations of the output signal from a ring oscillator. The ripple counter includes multiple, serially coupled flip-flops, which are shown as blocks 402, 404, 406, . . . , 408. Selection of data inputs and clock enable inputs to the flip-flops is controlled by the state of the scan enable signal 322 and associated multiplexers. Multiplexers 410 and 412 are associated with flip-flop 402, multiplexers 414 and 416 are associated with flip-flop 404, multiplexers 418 and 420 are associated with flip-flop 406, . . . , and multiplexers 422 and 424 are associated with flip-flop 408.

When in counting mode (scan enable signal 322 is not asserted), the associated multiplexer selects the inverted output of the flip-flop as feedback input to the data pin of each flip-flop. The inverted output of a flip-flop is sometimes referred to as Q-bar and is denoted in the figures as "Qb." In counting mode, the multiplexer 412 selects the ring oscillator signal 316 as the input to the clock enable pin of the leading flip-flop 402 in the ripple counter. The multiplexers associated with the flip-flops following the leading flip-flop select the inverted output from the previous flip-flop for input to the clock enable pin when in counting mode. For example, multiplexer 416 selects the inverted output from flip-flop 402 for input to the clock enable pin of flip-flop 404.

When in scan mode (scan enable signal 322 is asserted), multiplexer 410 selects the scan-in signal 314 for the data input pin of the leading flip-flop 402, and the multiplexers associated with each of the other flip-flop selects the data output of the preceding flip-flop for input to the data input pin. The multiplexers 412, 416, 420, . . . , 424 select the scan clock signal 320 for input to the clock enable pins of the flip-flops when in scan mode. The scan signals to and from the ripple counter can be coupled to the scan circuitry of the associated application-specific sub-circuit.

The reset signal 318 is provided to the reset pins of the flip-flops, and when asserted the flip-flops reset to 0 values.

Figure 5:
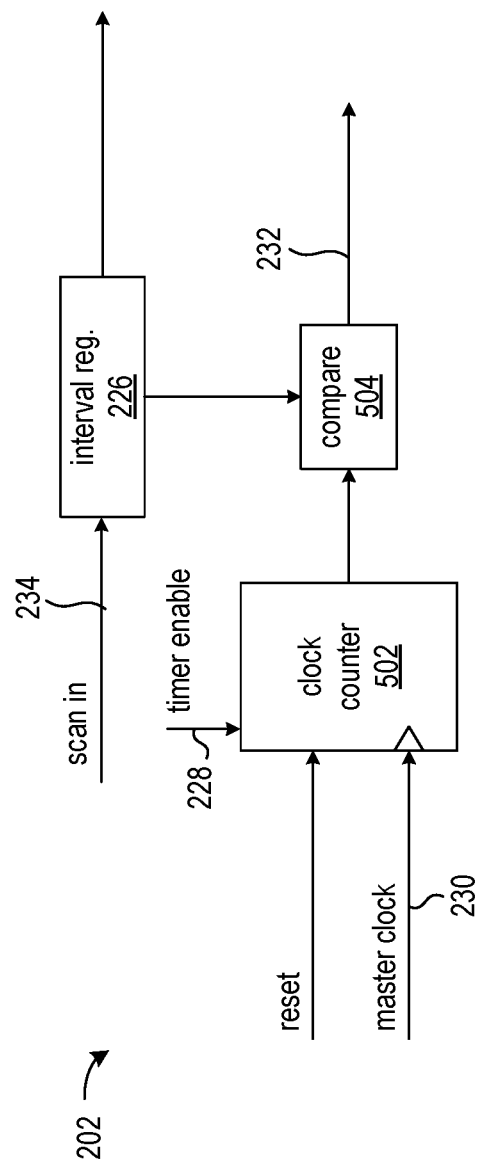
FIG. 5 shows an exemplary timer circuit.

FIG. 5 shows an exemplary timer circuit 202. The timer circuit includes an interval register 226, a clock counter circuit 502, and a compare circuit 504. The timer circuit is configured to track an interval of time, the duration of which can be specified in the interval register 226, which can be configured via scan-in signal 234. The clock counter 502 can be enabled by timer enable signal 228 and counts oscillations of master clock signal 230. Compare circuit 504 inputs the count value from clock counter 502 and the value from the interval register 226. The compare circuit maintains control signal 232 in an enable state until the value of the clock counter is equal to the value in the interval register. Once the value of the clock counter is equal to the value in the interval register, the compare circuit puts control signal into a disable state.

Figure 6:
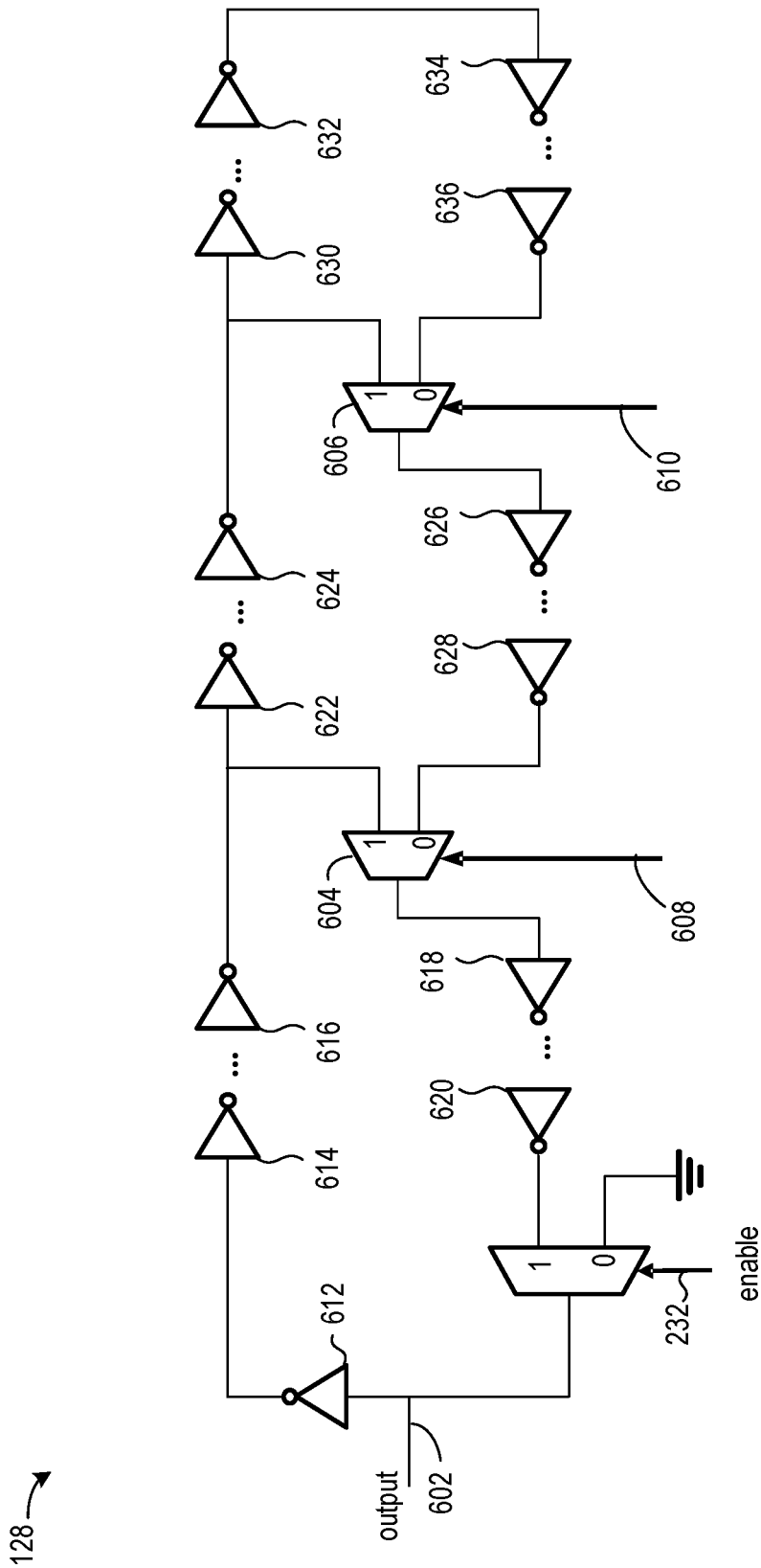
FIG. 6 shows an exemplary ring oscillator (RO)

FIG. 6 shows an exemplary ring oscillator (RO) 128. The ring oscillator includes multiple inverters coupled in a loop and selection circuitry that is configurable to connect different subsets of the plurality of inverters into a desired number of inverters in a loop, and thereby output a desired relative frequency. The control signal 232 in an enable state connects the output 602 of the ring oscillator to the ring of inverters, and the control signal in a disable state connects the output to ground.

Multiplexers 604 and 606 and control signals 608 and 610 control which subsets of inverters are connected in the ring oscillator. If multiplexer 604 selects the input at pin 1, the resulting ring oscillator includes inverters 612, 614, . . . , 616, 618, . . . , and 620, which produces output signal 602 having frequency f0. If multiplexer 604 selects the input at pin 0, and multiplexer 606 selects the input at pin 1, the resulting ring oscillator includes inverters 612, 614, . . . , 616, 622, . . . , 624, 626, . . . , 628, 618, . . . , and 620, which produces output signal 602 having frequency f1. If multiplexer 604 selects the input at pin 0, and multiplexer 606 selects the input at pin 0, the resulting ring oscillator includes inverters 612, 614, . . . , 616, 622, . . . , 624, 630, . . . , 632, 634, . . . , 636, 626, . . . , 628, 618, . . . , and 620, which produces output signal 602 having frequency f2. The resulting frequency relationship between f0, f1, and f2 is f0>f1>f2.

Though only two multiplexers are shown, those skilled in the art will recognize that additional multiplexers can be similarly connected to provide additional frequency selection options.

Figure 7:
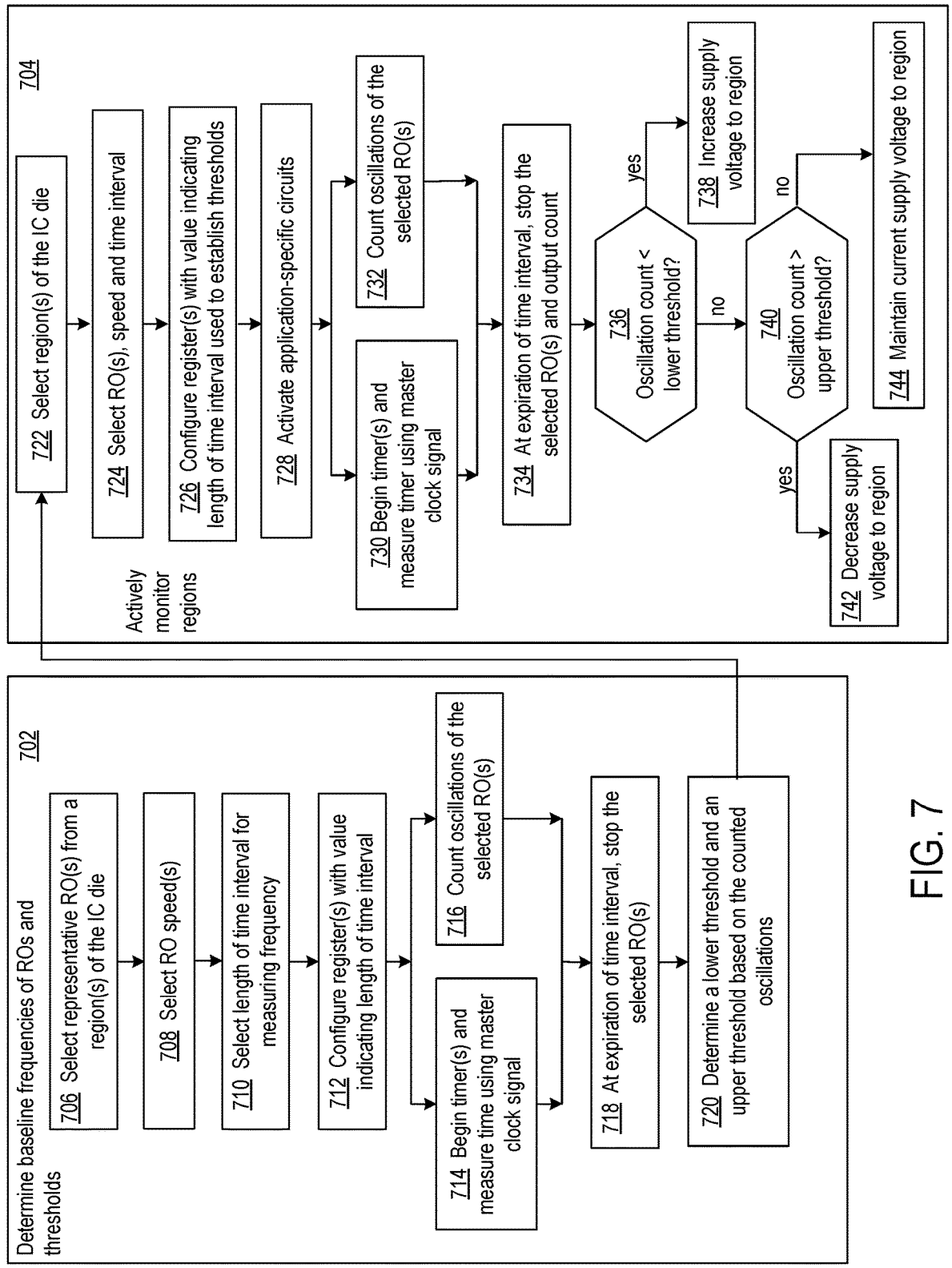
FIG. 7 shows a flow chart of a process for monitoring IC device performance at areas of application-specific sub-circuits.

FIG. 7 shows a flow chart of a process for monitoring IC device performance at areas of application-specific sub-circuits. Block 702 shows operations performed to determine baseline frequencies of the ring oscillators of the measuring circuits on the IC device, and block 704 shows operations involved in monitoring selected areas of the application-specific sub-circuits.

The processing of block 702 can be performed for all the areas of the application-specific sub-circuits of the device. At block 706, if the measuring circuit associated with an application-specific sub-circuit has multiple ring oscillators, a representative one of the ring oscillators can be selected. At block 708, the desired frequency of the ring oscillator can be selected if the ring oscillator is configurable to output a signal at a selected one of multiple frequencies. The duration of time over which the frequency of the output signal from the ring oscillator is measured is selected at block 710. At block 712 the selected instance(s) of the measuring circuit is configured with the data according to the selected ring oscillator, frequency, and interval. Control codes can be scanned-in to the measurement circuit to configure the registers that select the ring oscillator, configure the number of inverters in the ring oscillator, and specifies a value indicative of the time interval.

At block 714, the timer circuit(s) is started to begin measuring elapsed time, and concurrent with starting the timer circuit, at block 716 a counter circuit begins counting oscillations of the output signal from the selected ring oscillator(s). In response to expiration of the time interval, at block 718 the timer circuit stops the ring oscillator and counting oscillations ceases.

At block 720, a lower frequency threshold and an upper frequency threshold are determined based on the counted oscillations of the output signal(s) of the selected ring oscillator(s). The lower and upper frequency threshold may be based on an acceptable level of deviation from the baseline frequency. For example, if a deviation of 5% is acceptable, the lower frequency threshold can be 95% of the counted number of oscillations, and the upper frequency threshold can be 105% of the counted number of oscillations. The counted number of oscillations can be scanned out to a test controller, such as a computer system, for determining the thresholds.

Monitoring of the areas of the application-specific sub-circuits can begin at block 722. One or more areas of the application-specific sub-circuits can be selected for monitoring at block 722. The areas can be monitored in parallel or sequentially, depending on test objectives, and the selection of the area(s) may be based on routine maintenance needs or device troubleshooting.

At block 724, if the instance of the measuring circuit in the selected area has multiple ring oscillators, one of the ring oscillators is selected. The selected ring oscillator is the same ring oscillator as was selected at block 706 for baseline measurements. Also, at block 724, the speed of the ring oscillator and the time interval are selected. The selected speed is the same as the speed selected at block 708, and the selected time interval is the same as the time interval selected at block 710.

At block 726 the selected instance(s) of the measuring circuit is configured with the data according to the selected ring oscillator, frequency, and interval. Control codes can be scanned-in to the measurement circuit to configure the registers that select the ring oscillator, configure the number of inverters in the ring oscillator, and specify a value indicative of the time interval.

The monitoring of block 704 is performed while the application-specific sub-circuits are performing application functions. At block 728, the application-specific sub-circuits are activated to commence performing application functions. That is, the system clock(s) is distributed to the application-specific sub-circuits and application input signals are driven through non-test channels.

At block 730, the timer circuit(s) is started to begin measuring elapsed time, and concurrent with starting the timer circuit at block 732 a counter circuit begins counting oscillations of the output signal from the selected ring oscillator(s). In response to expiration of the time interval, at block 734 the timer circuit stops the ring oscillator and counting oscillations ceases, and the counter circuit output the counted number of oscillations.

Decision blocks 736 and 740 test whether the oscillation count is between the lower frequency threshold and the upper frequency threshold. The oscillation count can be scanned out to a computer system and compared to the frequency thresholds. If the oscillation count is less than the lower frequency threshold, the supply voltage to the area of the application-specific sub-circuit can be increased at block 738, and if the oscillation count is greater than the upper frequency threshold, the supply voltage to the area of the application-specific sub-circuit can be decreased at block 742. Some IC devices have programmable voltage controllers that are reprogrammable for adjusting supply voltage levels, and the voltage controllers can be accessed through generally available systems and known methods. If the oscillation count is between the lower frequency threshold and the upper frequency threshold, no change is made to the current supply voltage level 744.

The monitoring of block 704 can be repeated periodically. Different areas can be tested at different times. Multiple areas can be tested in parallel or areas can be individually tested in a round robin order.

Figure 8:
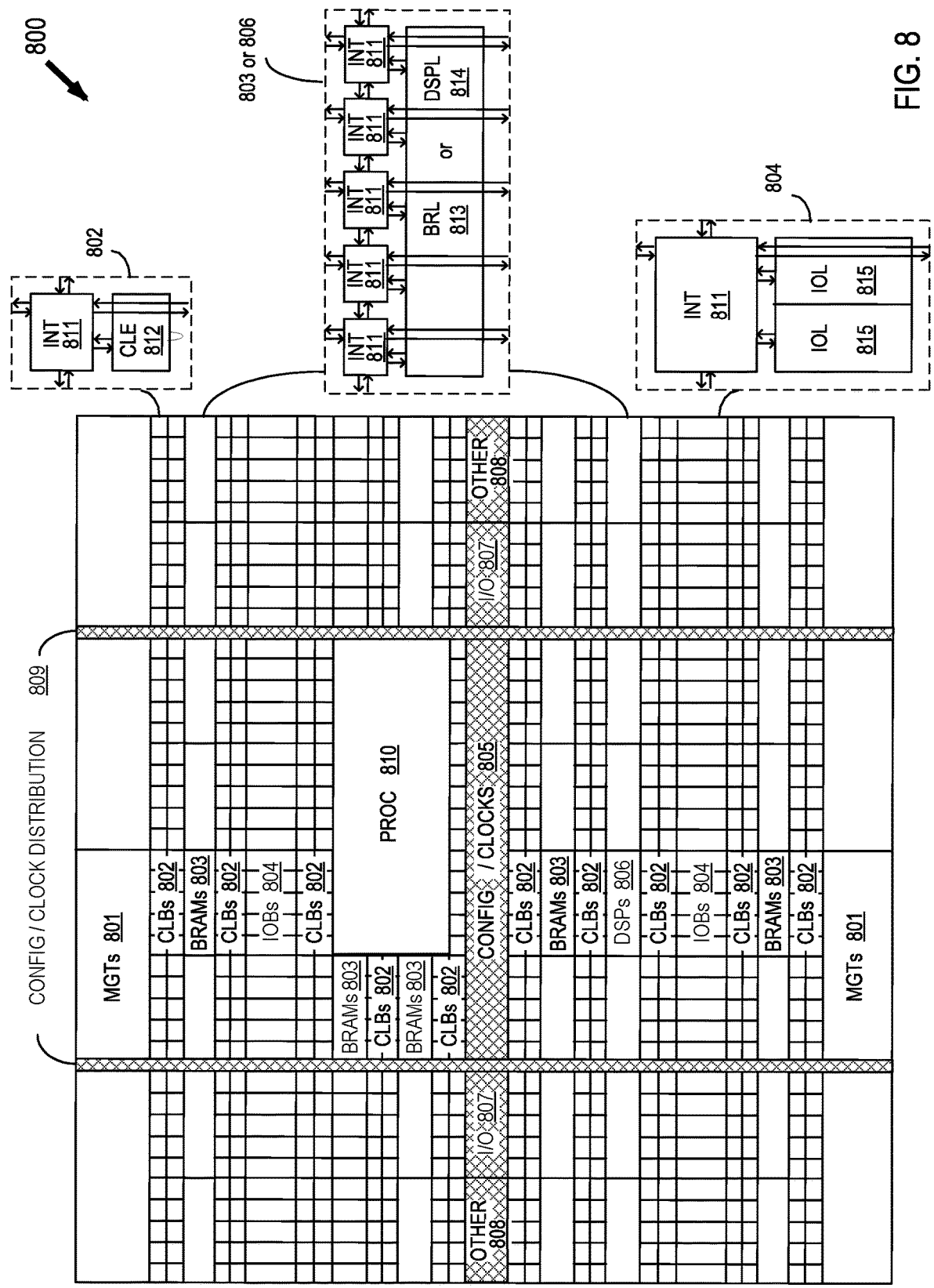
FIG. 8 shows a programmable integrated circuit (IC) on which the disclosed circuits and/or processes may be implemented.

FIG. 8 shows a programmable integrated circuit (IC) 800 on which the disclosed circuits and/or processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 8 illustrates programmable IC 800 that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 806 can include a DSP logic element (DSPL) 814 in addition to an appropriate number of programmable interconnect elements. An I/O 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

A columnar area near the center of the die (shown shaded in FIG. 8) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 8 include additional logic blocks that disrupt the regular columnar structure making up a large part of the programmable IC. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual programmable IC, more than one adjacent column of CLBs is typically included wherever the CLBs appear, to facilitate the efficient implementation of user logic.

Further examples of application-specific sub-circuits that can have associated measuring circuits include, for example, processor cores, floating point units (FPUs), on chip-memory, memory caches, and/or cache coherent interconnect; different types of memory circuits including, but not limited to, Double Data Rate (DDR) 2, DDR3, and DDR4 types of memory, whether 16-bit, 32-bit, 16-bit with ECC, etc.; various types of I/O devices or interfaces including for example, flash memory type I/O devices, higher performance I/O devices, lower performance interfaces, debugging I/O devices, and/or RAM I/O devices; Universal Asynchronous Receiver/Transmitter (UART) type interfaces, Serial Peripheral Interface (SPI) bus type interfaces, Controller-Area-Network (CAN) type interfaces and/or an inter-integrated circuit (I²C) type interfaces; and safety circuits that monitor the status of the subsystems to ensure correct operation.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for monitoring circuit performance. Other aspects and features will be apparent to those skilled in the art from consideration of the specification. The circuits and methods can be implemented as an application specific integrated circuit (ASIC) or as a logic on a programmable logic device. It is intended that the specification and drawings be considered as examples only, with a true scope of the invention being indicated by the following claims.

What is claimed is:

1. A circuit arrangement, comprising:
   an integrated circuit (IC) device that includes a plurality of separate areas;
   a plurality of application-specific sub-circuits, each disposed within one of the respective areas of the IC device;
   a plurality of instances of a measuring circuit, wherein:
      each instance is disposed within the respective area of an associated one of the application-specific sub-circuits, and each application-specific sub-circuit is associated with one and only one of the plurality of instances,
      each instance includes a plurality of ring oscillators and a register for storage of a value indicative of an interval of time, and a first selection circuit configured to input a plurality of output signals from the plurality of ring oscillators, respectively, and select one of the plurality of output signals for counting oscillations in response to a control signal, and
      each instance is configured to:
         measure passage of the interval of time based on a first clock signal,
         count oscillations of the one output signal of the one of the plurality of ring oscillators during the interval of time, and
         output a value indicating a number of oscillations counted during the interval of time.

2. The circuit arrangement of claim 1, wherein each instance of the measuring circuit includes:
   a timer circuit configured to track the interval of time in response to the first clock signal, generate a control signal in an enable state during the interval, and generate the control signal in a disable state upon expiration of the interval, and
   a first counter circuit coupled to the plurality of ring oscillators and configured to commence counting oscillations of the one output signal in response to the enable state of the control signal and output a count value in response to the disable state of the control signal.

3. The circuit arrangement of claim 2, wherein each application-specific sub-circuit is configured to perform application functions concurrent with the timer circuit tracking the interval of time.

4. The circuit arrangement of claim 3, wherein the timer circuit includes a second counter circuit configured to count oscillations of the first clock signal to track the interval of time.

5. The circuit arrangement of claim 2, wherein the first counter circuit is a ripple counter.

6. The circuit arrangement of claim 2, wherein the register is reprogrammable to store values indicative of different intervals of time.

7. The circuit arrangement of claim 6, wherein the plurality of application-specific sub-circuits and instances of the measuring circuit are coupled in one or more scan chains.

8. The circuit arrangement of claim 1, further comprising a programmable voltage controller configured to adjust supply voltage levels to each area of the IC device in response to the numbers of oscillations counted and a threshold count.

9. The circuit arrangement of claim 1, wherein each ring oscillator includes:
   a plurality of inverters coupled in a loop; and
   a second selection circuit configurable to connect different subsets of the plurality of inverters in response to control signals.

10. The circuit arrangement of claim 1, wherein each instance of the measuring circuit includes:
   a timer circuit configured to track the interval of time in response to the first clock signal, generate a control signal in an enable state during the interval, and generate the control signal in a disable state upon expiration of the interval, and
   a first counter circuit coupled to the plurality of ring oscillators and configured to commence counting oscillations of the one output signal in response to the enable state of the control signal and output a count value in response to the disable state of the control signal;

wherein each application-specific sub-circuit is configured to perform application functions concurrent with the timer circuit tracking the interval of time; and wherein each ring oscillator of the plurality of ring oscillators includes:

a plurality of inverters coupled in a loop, and a selection circuit configurable to connect different subsets of the plurality of inverters in response to control signals.

11. A method comprising:

selecting one or more areas of a plurality of separate areas of an integrated circuit (IC) device for evaluation, wherein a plurality of application-specific sub-circuits are disposed within the separate areas of the IC device, respectively, each instance of a plurality of instances of a measuring circuit is disposed within the respective area of an associated one of the plurality of application-specific sub-circuits, and each application-specific sub-circuit is associated with one and only one of the plurality of instances;

configuring one or more reprogrammable registers disposed within the one or more areas, respectively, with a value indicative of an interval of time;

measuring passage of the interval of time by one or more timer circuits disposed within the one or more areas, respectively, based on a first clock signal;

selecting in each of the one or more areas, one output signal from one ring oscillator of a respective plurality of ring oscillators disposed within the one or more areas;

counting oscillations of the one output signal of the one ring oscillator disposed within the one or more areas, respectively, during the interval of time; and outputting one or more values indicating respective numbers of oscillations counted during the interval of time in the one or more areas.

12. The method of claim 11, further comprising operating the plurality of application-specific sub-circuits concurrent with the measuring and counting.

13. The method of claim 11, further comprising:

selecting at one or more other areas of the IC device other than the one or more areas;

configuring one or more reprogrammable registers disposed within the one or more other areas, respectively, with a value indicative of the interval of time;

selecting in the one or more other areas, one ring oscillator from a respective plurality of ring oscillators disposed within the one or more other areas;

measuring passage of the interval of time by one or more timer circuits disposed within the one or more other areas, respectively, based on the first clock signal;

counting oscillations of the one ring oscillator disposed within the one or more other areas, respectively, during the interval of time; and outputting one or more values indicating respective numbers of oscillations counted during the interval of time.

14. The method of claim 11, wherein:

the configuring includes operating scan circuitry that scans-in the value indicative of the interval of time into the one or more reprogrammable registers; and and the outputting includes operating scan circuitry that scans-out the one or more values.

15. The method of claim 11, further comprising configuring one or more selection registers disposed within the one or more areas, respectively, with a value that causes selection of the one of the plurality of ring oscillators.

16. The method of claim 11, wherein each ring oscillator is configurable to operate at one frequency of a plurality of different frequencies, and the method further includes configuring each ring oscillator to operate at the one frequency.

17. The method of claim 16, wherein the configuring each ring oscillator includes configuring one or more control registers disposed within the one or more areas, respectively, with a value that causes each ring oscillator to operate at the one frequency.

18. The method of claim 11, further comprising:

determining whether each of the one or more values is within a target range; and adjusting a supply voltage to an area of the one or more areas in response to a value of the one or more values being outside the target range.

19. The method of claim 11, wherein each of the one or more ring oscillators is configurable to operate at one frequency of a plurality of different frequencies, and the method further comprising:

operating the plurality of application-specific sub-circuits concurrent with the measuring and counting; and configuring each ring oscillator to operate at the one frequency.

* * * * *